United States Patent
Trajkovska-Broach et al.

(10) Patent No.: US 10,061,175 B2
(45) Date of Patent: Aug. 28, 2018

(54) ELECTROCHROMIC FILMS AND RELATED METHODS THEREOF

(71) Applicant: e-Vision, LLC, Sarasota, FL (US)

(72) Inventors: Anita Trajkovska-Broach, Christiansburg, VA (US); Ying Sun, Zurich (CH); William Kokonaski, Gig Harbor, WA (US)

(73) Assignee: e-Vision, LLC, Sarasota, FL (US)

( * ) Notice: Subject to any disclaimer, the term of this patent is extended or adjusted under 35 U.S.C. 154(b) by 149 days.

(21) Appl. No.: 14/341,349

(22) Filed: Jul. 25, 2014

(65) Prior Publication Data

US 2015/0027613 A1 Jan. 29, 2015

Related U.S. Application Data

(60) Provisional application No. 61/858,214, filed on Jul. 25, 2013.

(51) Int. Cl.
| | |
|---|---|
| *C23C 14/22* | (2006.01) |
| *G02F 1/15* | (2006.01) |
| *C25D 13/12* | (2006.01) |
| *C25D 7/00* | (2006.01) |
| *C25D 13/02* | (2006.01) |
| *C25D 9/04* | (2006.01) |

(Continued)

(52) U.S. Cl.
CPC ............. *G02F 1/15* (2013.01); *C23C 14/083* (2013.01); *C23C 14/226* (2013.01); *C23C 14/505* (2013.01); *C25D 7/00* (2013.01); *C25D 9/04* (2013.01); *C25D 13/02* (2013.01); *C25D 13/12* (2013.01); *B82Y 30/00* (2013.01); *G02F 2202/36* (2013.01); *Y10T 156/10* (2015.01)

(58) Field of Classification Search
CPC ... Y10T 156/10; C23C 14/225; C23C 14/226; C25D 13/02; C25D 13/12; B82Y 30/00
See application file for complete search history.

(56) References Cited

U.S. PATENT DOCUMENTS

| 4,390,246 A | 6/1983 | Miyoshi |
| 4,447,133 A * | 5/1984 | Miyoshi ............... C23C 14/226 359/265 |

(Continued)

FOREIGN PATENT DOCUMENTS

| JP | S55 77724 A | 6/1980 |
| WO | WO 2013/016318 A2 | 1/2013 |

OTHER PUBLICATIONS

Baeck, S.H., Jaramillo, T., Stucky, G.D., & McFarland, E.W. (2002). Controlled Electrodeposition of Nanoparticular Tungsten Oxide. Nano Letters. vol. 2, No. 8, 831-834.*

(Continued)

*Primary Examiner* — Carson Gross
(74) *Attorney, Agent, or Firm* — Smith Baluch LLP

(57) ABSTRACT

EC film stacks and different layers within the EC film stacks are disclosed. Methods of manufacturing these layers are also disclosed. In one embodiment, an EC layer comprises nanostructured EC layer. These layers may be manufactured by various methods, including, including, but not limited to glancing angle deposition, oblique angle deposition, electrophoresis, electrolyte deposition, and atomic layer deposition. The nanostructured EC layers have a high specific surface area, improved response times, and higher color efficiency.

25 Claims, 15 Drawing Sheets

(51) Int. Cl.
*C23C 14/08* (2006.01)
*C23C 14/50* (2006.01)
*B82Y 30/00* (2011.01)

(56) References Cited

U.S. PATENT DOCUMENTS

| | | |
|---|---|---|
| 4,488,781 A | 12/1984 | Giglia |
| 5,277,986 A | 1/1994 | Cronin et al. |
| 5,666,771 A * | 9/1997 | Macquart .............. G02F 1/1523 359/260 |
| 7,265,890 B1 | 9/2007 | Demiryont |
| 2003/0156313 A1 | 8/2003 | Serra et al. |
| 2005/0248824 A1* | 11/2005 | Fukazawa ............. G02F 1/1523 359/265 |
| 2007/0089784 A1* | 4/2007 | Noh ....................... B82Y 10/00 136/263 |
| 2007/0097481 A1* | 5/2007 | Burdis .................. G02F 1/1525 359/265 |
| 2008/0304131 A1 | 12/2008 | Nguyen |
| 2009/0316248 A1 | 12/2009 | Karmhag et al. |
| 2010/0245973 A1* | 9/2010 | Wang .................. C03C 17/3417 359/275 |
| 2010/0313875 A1 | 12/2010 | Kennedy |
| 2012/0120476 A1 | 5/2012 | Yeh et al. |
| 2012/0120477 A1* | 5/2012 | Biver ...................... G02F 1/155 359/275 |

OTHER PUBLICATIONS

International Search Report for International Appl. No. PCT/2014048221 ISA/US Patent Office, Alexandria, VA, dated Jan. 23, 2015, 4 pages.

Extended European Search Report dated Mar. 16, 2017 for European Application No. EP 14828965.5, 10 pages.

Le Bellac, D. et al., "Angular selective transmittance through electrochromic tungsten oxide films made by oblique angle sputtering," Appl. Phys. Lett. 66, 1715-1716 (1995); https://doi.org/10.1063/1.113343.

* cited by examiner

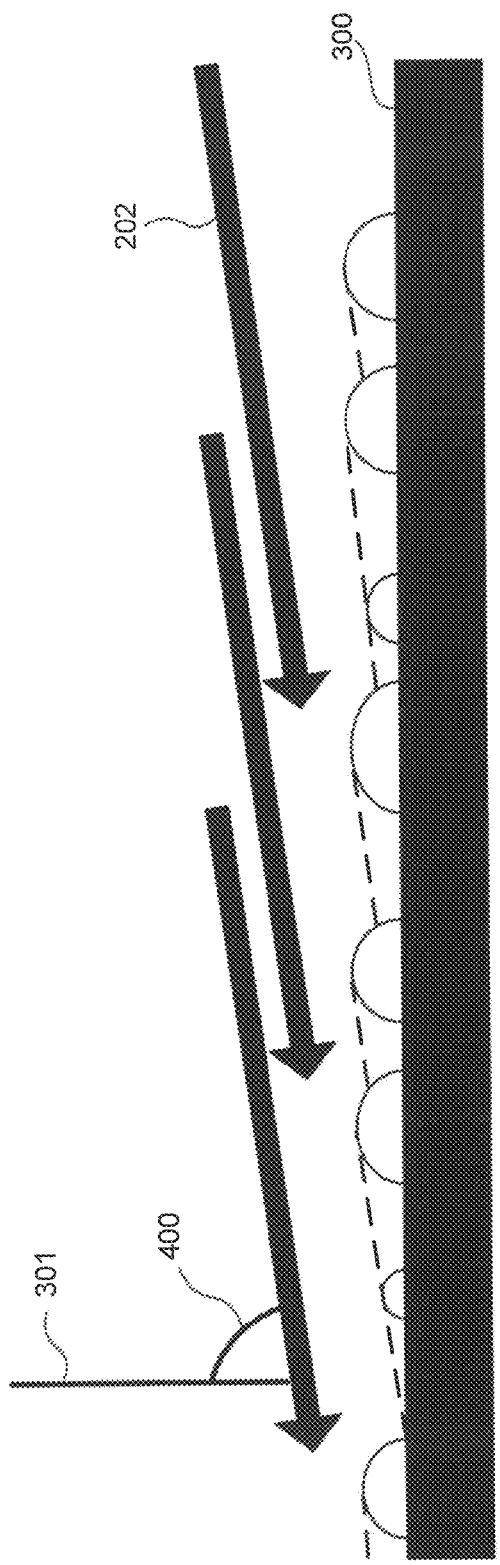

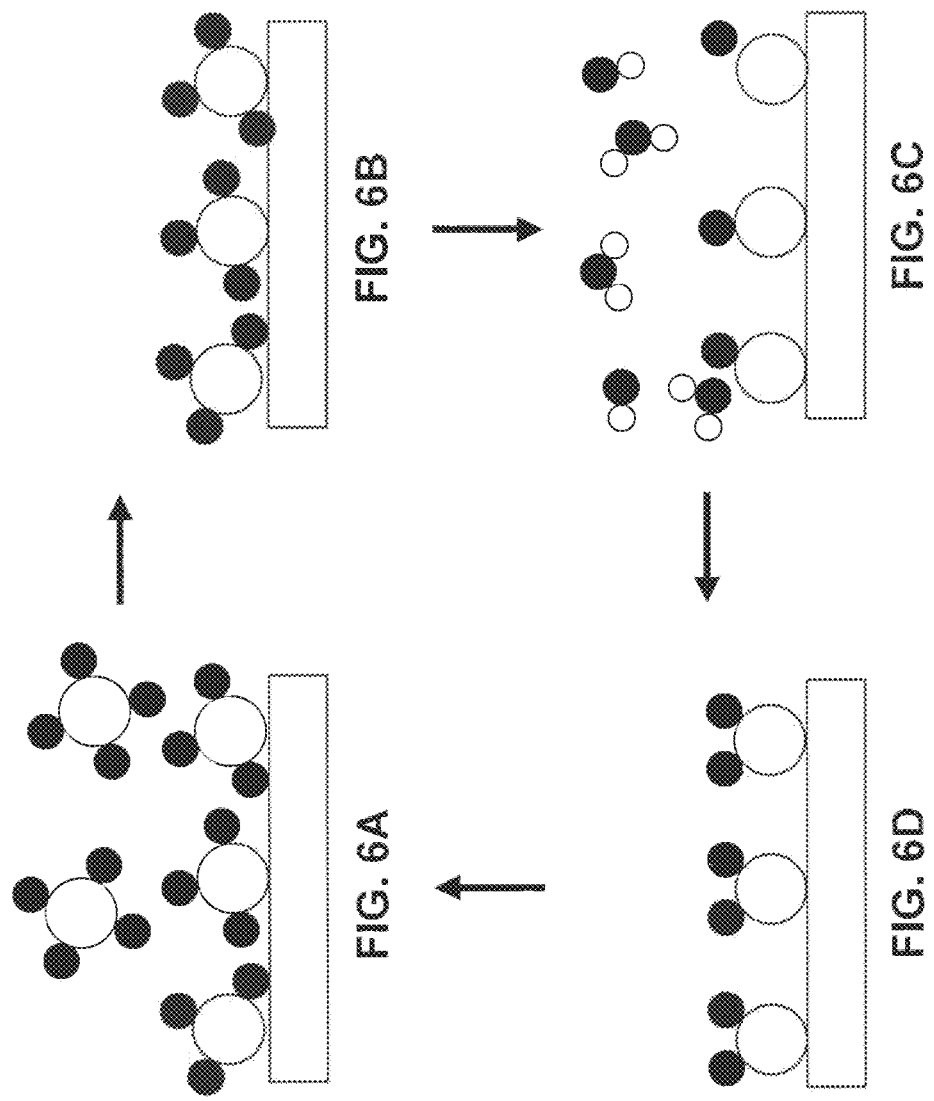

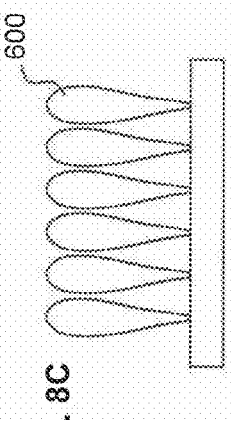
FIG. 8A
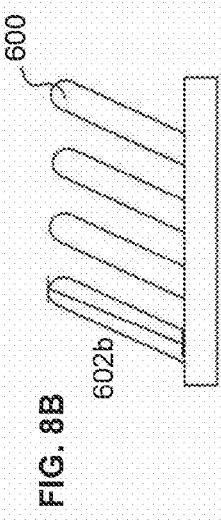
FIG. 8D
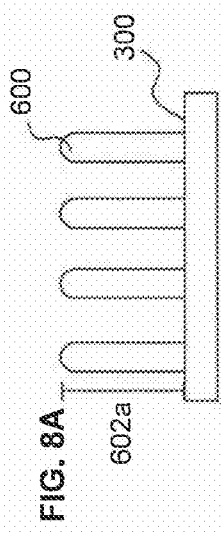
FIG. 8G
FIG. 8J
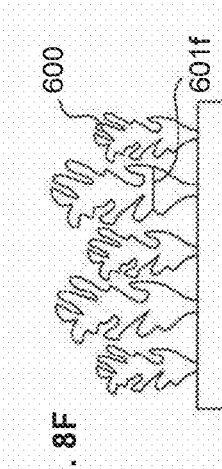
FIG. 8B
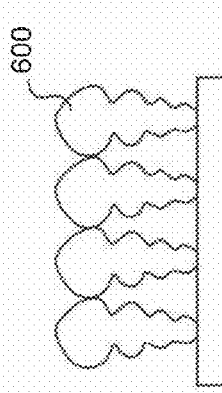
FIG. 8E
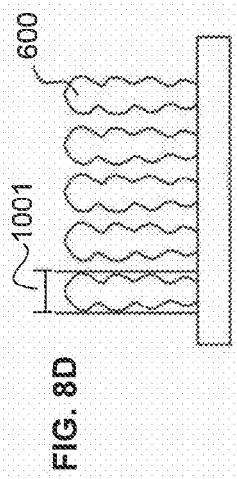
FIG. 8H
FIG. 8K
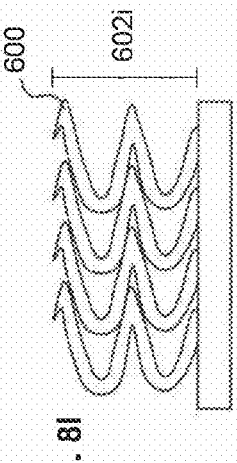
FIG. 8C
FIG. 8F
FIG. 8I
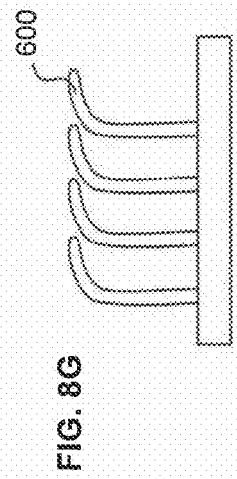
FIG. 8L
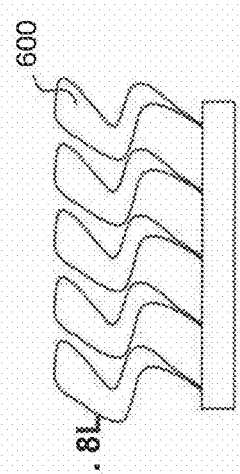
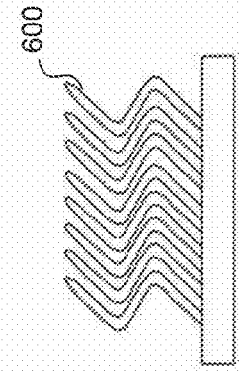
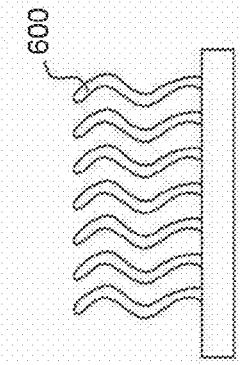

ELECTROCHROMIC FILMS AND RELATED METHODS THEREOF

CROSS-REFERENCE TO RELATED APPLICATIONS

This application claims the benefit of U.S. Provisional Application No. 61/858,214, filed on Jul. 25, 2013, which is incorporated by reference in its entirety.

BACKGROUND OF THE INVENTION

Field of the Invention

Embodiments disclosed herein relate to electro-chromic films and methods and applications thereof.

Background

Electro-chromic (EC) film stacks may be applied to surfaces when it is desirable to change the optical transmission properties of the surface. For example, the stacks may be applied to ophthalmic lenses to reduce transmission of harmful ultra-violet light through the lenses. An electro-chromic film stack generally comprises at least one electro-chromic layer in contact with at least one ion conductor layer. When a voltage is applied, ions and electrons are transferred between the different layers, resulting in a change of the optical properties of the stack. When the voltage is turned off, the stack's optical properties return to the unaltered state.

Despite the large number of on-going research studies in the field of various EC technologies, there is still a need of compact and mechanically-robust solid-state electro-chromic film stack, which can be easily applied on existing ophthalmic lens blanks, semi-finished blanks (SFB), or other surfaces that need controllable variable transmission performance. It may also be desirable for such EC stack to operate under lower voltage, and thus, not require large, heavy and aesthetically non-acceptable batteries. In addition, the variable-transmission EC stack should be first-responding with a satisfactory dynamic range compared to the current available photochromic lenses and other switching technologies. Moreover, such robust EC stack has a potential to be applied to any other large area transparent surfaces. These include but are not limited to architectural windows, glass roofs, car windshields, and other applications that require controllable transmission for energy-saving and other purposes.

The EC film stack should also survive all post-processing steps of the surfaces that it is applied to. For instance, if applied to ophthalmic SFBs, it should survive the surfacing to different lens prescriptions, edging into different lens shapes and grooving steps, which is not the case with non-solid EC devices utilizing liquid electrolytes. Furthermore, if the solid EC film stack can be deposited on a single substrate, it would be very beneficial for the reduction the "bulkiness" of the final product such as but not limited to ophthalmic lens, motorcycle helmets, and windows.

BRIEF SUMMARY OF THE INVENTION

In one embodiment, a method comprises: depositing an electro-chronic material over a surface of a substrate having a surface normal to form a nanostructured electro-chromic layer by exposing the surface to a flux of the electro-chromic material traveling in a first direction. The incident angle between the first direction and the surface normal is at least 1 degree and at most 89 degrees.

In one embodiment, the incident angle is at least 1 degree and less than 10 degrees. In one embodiment, the incident angle is at least 10 degrees and less than 80 degrees. In one embodiment, the incident angle is at least 80 degrees and at most 89 degrees.

In one embodiment, the method comprises rotating the substrate relative to the flux while depositing the electro-chromic material. In one embodiment, the substrate is not rotated relative to the flux while depositing the electro-chromic material.

In one embodiment, the method further comprises depositing a first ion-conducting layer over the nanostructured layer after depositing the electro-chromic material and depositing a second ion conducting layer over the first ion-conducting layer after depositing the first ion-conducting layer to form an electro-chromic optical device.

In one embodiment, the electro-chromic material comprises two electro-chromic materials and the step of depositing comprises co-depositing two electro-chromic materials over the surface.

In one embodiment, the electro-chromic material consists essentially of a single electro-chromic material.

In one embodiment, the nanostructured electro-chromic layer comprises at least one columnar structure.

In one embodiment, the at least one columnar structure and the normal of the surface form an angle that is less than the incident angle.

In one embodiment, the nanostructured electro-chromic layer has feature sizes ranging from 1 nanometer to 500 nanometers.

In one embodiment, the electro-chromic material is selected from a group consisting of: tungsten oxide, nickel oxide, iridium oxide, molybdenum oxide, vanadium oxide, and combinations thereof. In one embodiment, the electro-chromic material is tungsten oxide.

In one embodiment, the formulation of a nanostructured electro-chromic layer is accomplished by a combination of: (1) exposing the surface to a flux of the electro-chromic material traveling in a first direction, and (2) at least one of sol-gel, dip-coating, spin-coating, knife coating, annealing, and sintering.

In one embodiment, the nanostructured electro-chromic layer has a specific surface area greater than 50 $m^2/g$. In one embodiment, the nanostructured electro-chromic layer has a coloration efficiency of greater than 50 $cm^2/C$. In one embodiment, the electro-chromic material is selected from the group consisting of: nickel oxide, iridium oxide, molybdenum oxide, vanadium oxide, and combinations thereof.

In one embodiment, the electro-chromic layer comprises a mixture of two different electro-chromic materials.

In one embodiment, a method comprises depositing a first electro-chromic material over a surface of a first substrate having a first surface normal to form a first nanostructured electro-chromic layer by exposing the surface to a first flux of the electro-chromic material traveling in a first direction. The incident angle between the first direction and the first normal is at least 1 degree and at most 89 degrees. The method further comprises depositing a second electro-chromic material over a surface of a second substrate having a second surface normal to form a second nanostructured electro-chromic layer by exposing the surface to a second flux of the second electro-chromic material traveling in a second direction. The incident angle between the second direction and the second normal is at least 1 degree and at most 89 degrees. The method further comprises depositing a first ion-conducting layer over the first nanostructured layer, depositing a second ion-conducting layer over the second nanostructure layer, and assembling the first substrate and the second substrate such that the first ion-conducting layer and the second ion-conducting layer are in contact form an electro-chromic optical system.

In one embodiment, wherein the first and second nanostructured layers have the same material composition. In one embodiment, the first and second nanostructured layers have different material compositions.

In one embodiment, a method comprises depositing an electro-chromic material over a surface of a substrate using electrophoresis or electro-deposition to form a nanostructured electro-chromic layer.

In one embodiment, the depositing is done by electrophoresis. In one embodiment, the depositing is done by electro-deposition.

In one embodiment, the method further comprises depositing a pre-cursor material on the surface before depositing the electro-chromic material and removing the pre-cursor material from the surface after depositing the electro-chromic material.

In one embodiment, the pre-cursor material comprises polystyrene.

In one embodiment, the step of depositing comprises co-depositing two electro-chromic materials and the nanostructured electro-chromic layer comprises a mixture of two electro-chromic materials.

In one embodiment, the electro-chromic material consists essentially of a single electro-chromic material.

In one embodiment, the nanostructured electro-chromic layer comprises at least one columnar structure.

In one embodiment, the at least one columnar structure and the normal of the surface are not parallel to each other.

In one embodiment, the nanostructured electro-chromic layer has feature sizes ranging from 1 nanometer to 500 nanometers.

In one embodiment, the electro-chromic material is selected from a group consisting of: tungsten oxide, nickel oxide, iridium oxide, molybdenum oxide, vanadium oxide, and combinations thereof. In one embodiment, the electro-chromic material is tungsten oxide.

In one embodiment, the method further comprises at least one of sol-gel, dip-coating, spin-coating, knife coating, annealing, and sintering.

In one embodiment, the nanostructured electro-chromic layer has a specific surface area greater than 50 $m^2/g$. In one embodiment, the nanostructured electro-chromic layer has a coloration efficiency of greater than 50 $cm^2/C$. In one embodiment, the electro-chromic material is selected from the group consisting of: nickel oxide, iridium oxide, molybdenum oxide, vanadium oxide, and combinations thereof.

In one embodiment, the electro-chromic layer comprises a mixture of two different electro-chromic materials.

In one embodiment, the formation of a nanostructured electro-chromic layer is accomplished by a combination of: (1) depositing an electro-chromic material over a surface using electrophoresis or electro-deposition and (2) at least one of sol-gel, dip-coating, spin-coating, knife coating, annealing, and sintering.

In one embodiment, an electro-chromic device comprising a substrate and a nanostructured electro-chromic layer disposed over the substrate. The electro-chromic layer comprises a mixture of at least two compounds, wherein both compounds are selected from the group consisting of ceramics, metals, and polymers.

In one embodiment, the first compound is different from the second compound.

In one embodiment, a method comprises, performing the following steps in order: depositing a monolayer of a precursor material over a first surface of a substrate by exposing the first surface to a precursor material and exposing the first surface to a vapor reactant. The monolayer of precursor material undergoes a reaction when exposed to the vapor reactant to form a nano-layer on the first surface.

In one embodiment, wherein the nano-layer comprises a uniform thickness. In one embodiment, the nano-layer comprises at least one nanostructure. In one embodiment, the nanostructure has at least one feature size ranging from 1 nanometer to 500 nanometers.

In one embodiment, the nano-layer is comprised of electro-chromic material. In one embodiment the electro-chromic material is tungsten oxide. In one embodiment, the electro-chromic material is selected from a group consisting of: tungsten oxide, nickel oxide, iridium oxide, molybdenum oxide, vanadium oxide, and combinations thereof. In one embodiment, the electro-chromic material comprises a mixture of two different electro-chromic materials.

In one embodiment, the formation of a nano-layer is accomplished by a combination of: (1) depositing a monolayer of a precursor material over a first surface by exposing the first surface to a precursor material and exposing the first surface to a vapor reactant, and (2) at least one of sol-gel, dip-coating, spin-coating, knife coating, annealing, and sintering.

In one embodiment, the nano-layer has a specific surface area greater than 50 $m^2/g$. In one embodiment, the nano-layer has a coloration efficiency of greater than 50 $cm^2/C$.

BRIEF DESCRIPTION OF THE DRAWINGS/FIGURES

FIG. 2A show the nucleation step of angle deposition.

Figure 3A:
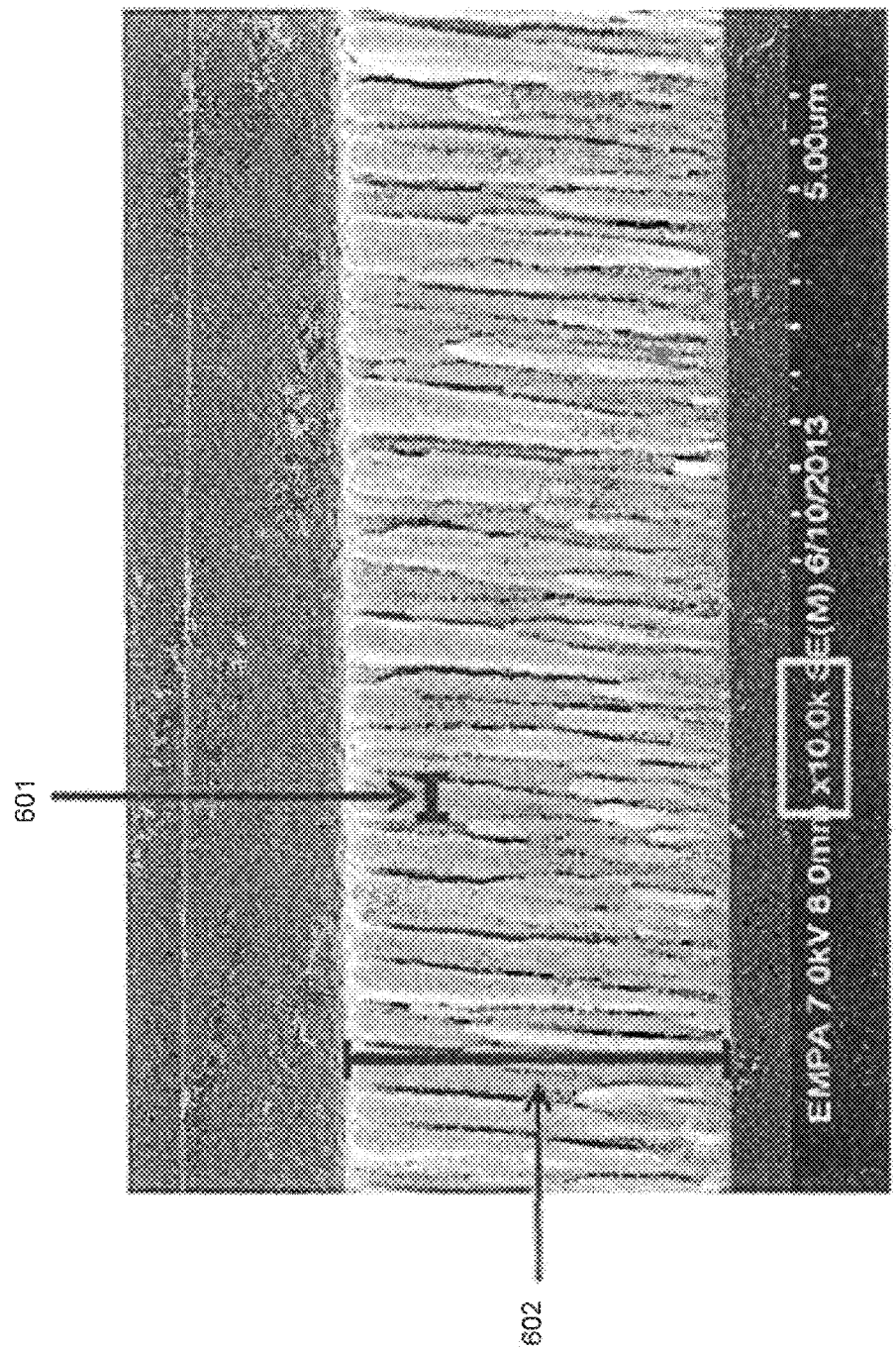
Figure 3B:
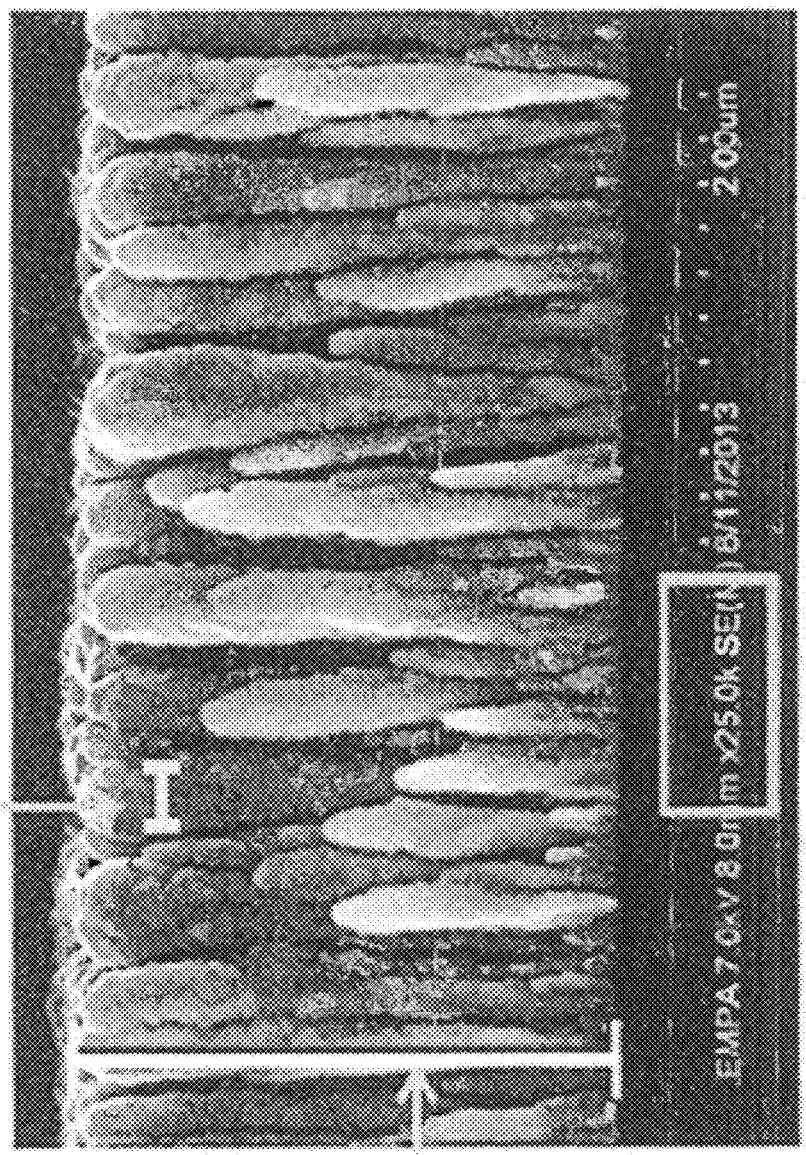

FIGS. 3A-B show SEM images of some exemplary nanostructured layers obtained by GLAD.

Figure 4:
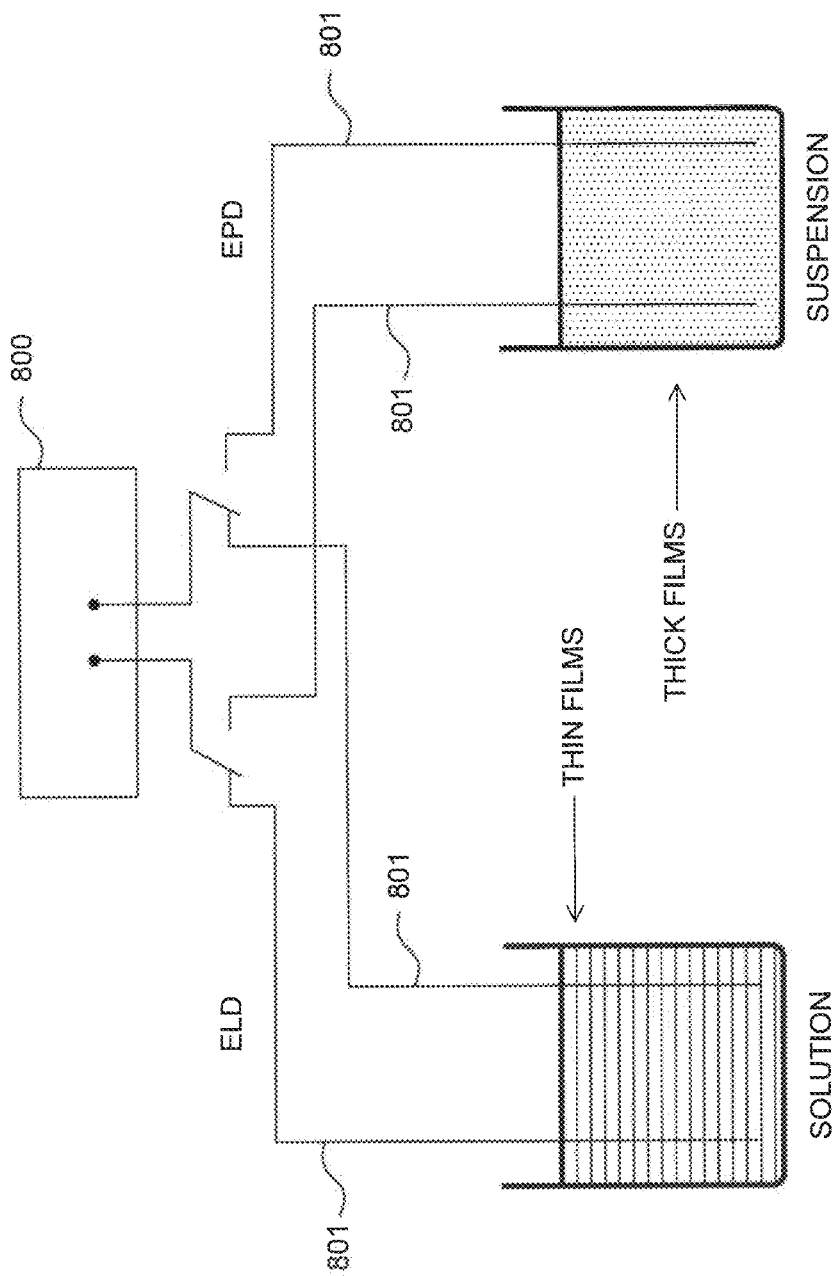

FIG. 4 shows a schematic representation of electrophoretic deposition and electro-deposition, according to one embodiment.

Figure 5A:
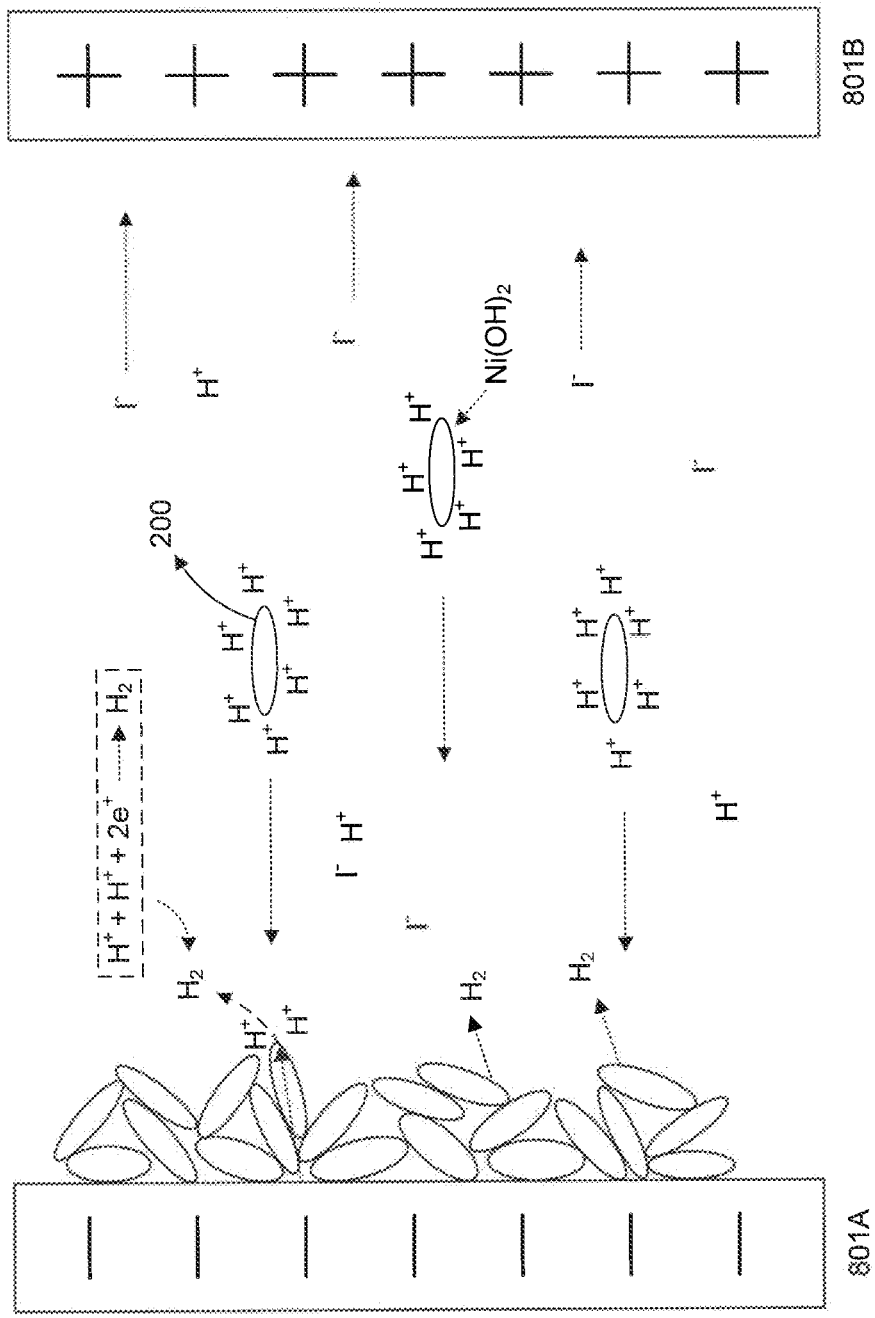

FIG. 5A shows a schematic representation of electrophoretic deposition of $Ni(OH)_2$ powder.

Figure 5B:
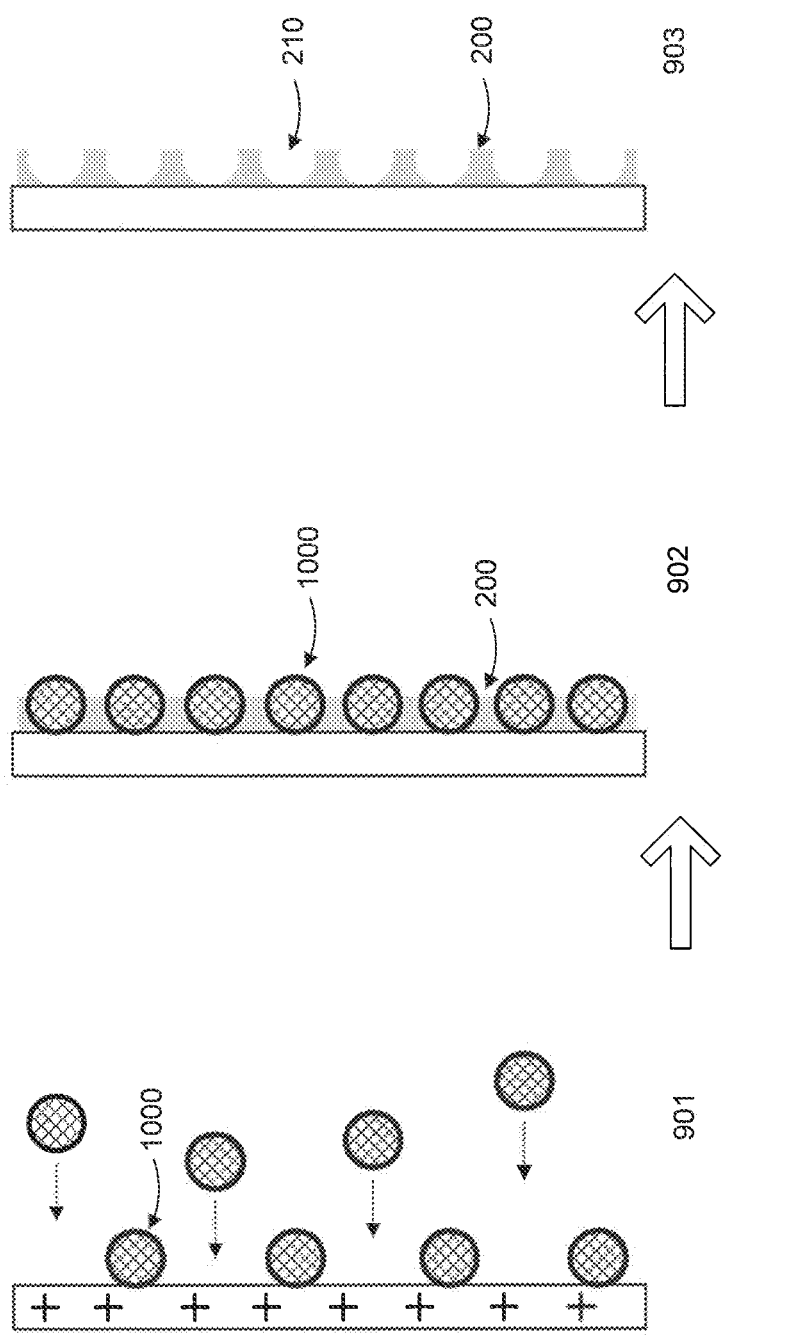

FIG. 5B shows a schematic representation of electrophoretic deposition of a non-porous NiO.

FIGS. 6A-D show a schematic representation of atomic layer deposition.

Figure 7A:
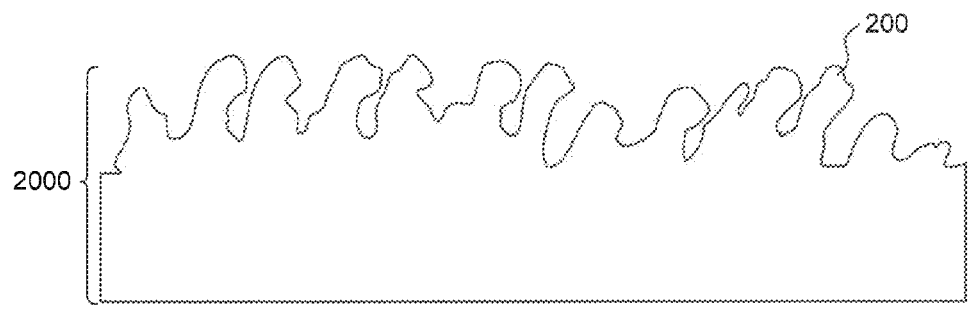
Figure 7B:
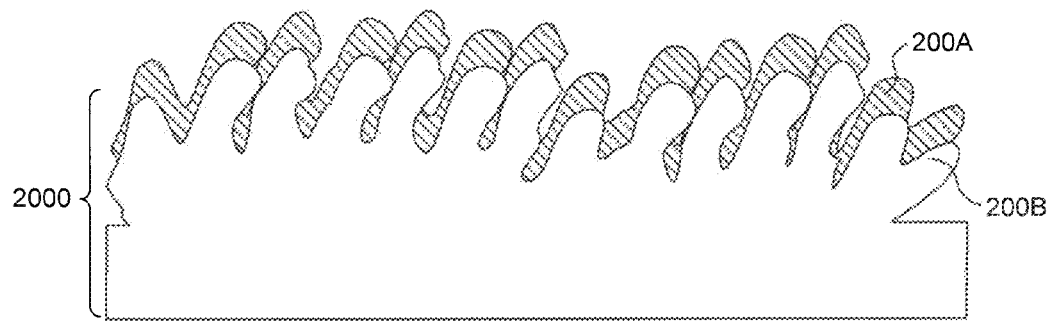
Figure 7C:
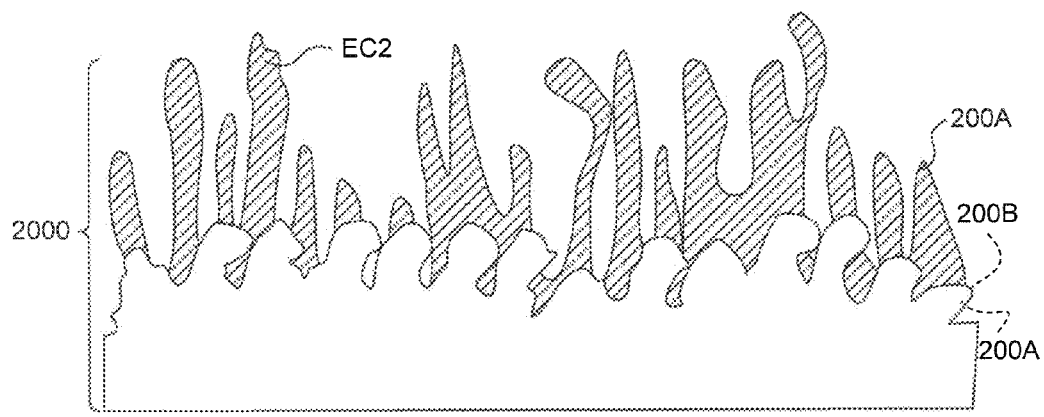

FIG. 7A shows a nanostructured electro-chromic layer with a single electro-chromic material. FIG. 7B shows a nanostructured electro-chromic layer with two materials prepared using the same method. FIG. 7C shows a nanostructured electro-chromic layer.

FIGS. 8A-L show nanostructured electro-chromic layers with columnar structures.

Figure 9:
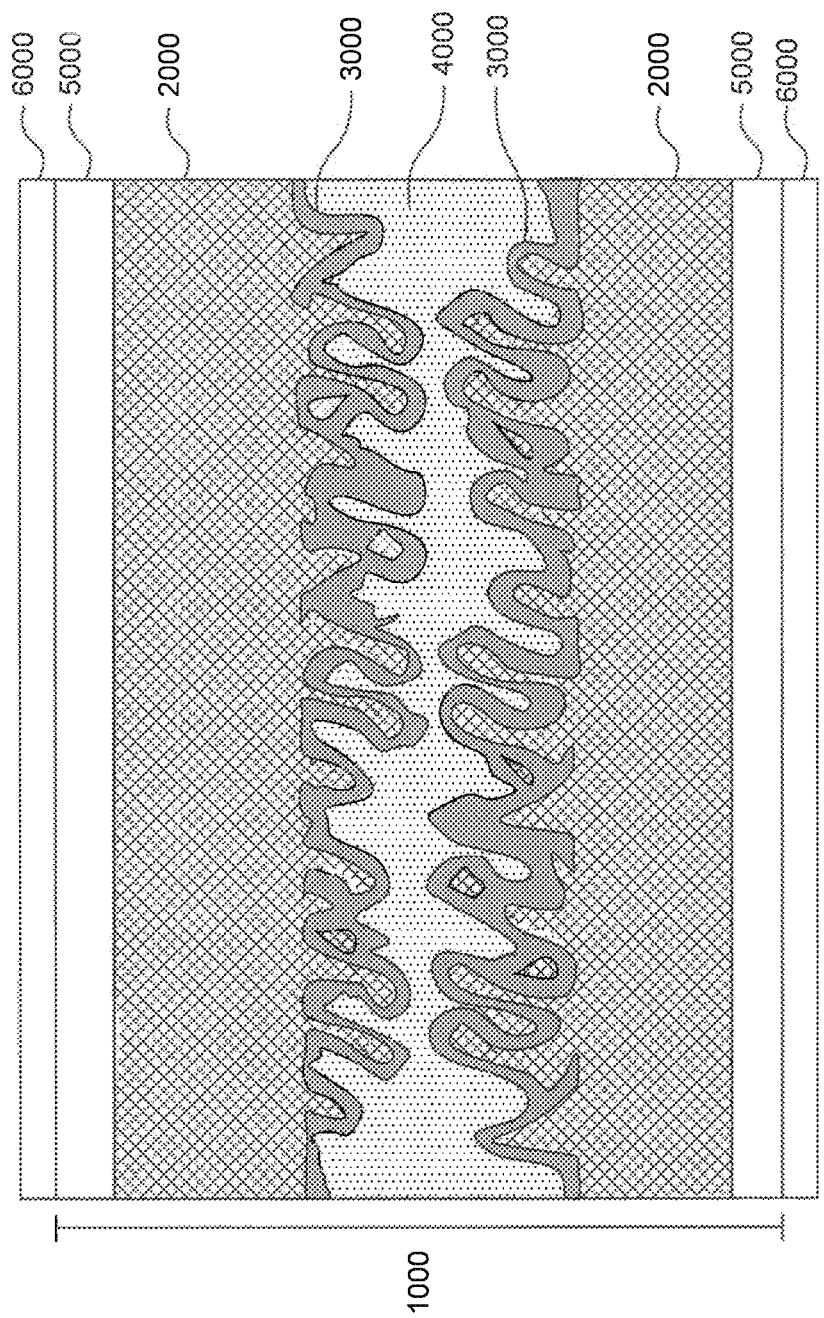

FIG. 9 shows an electro-chromic film with electro-chromic layers.

Figure 10B:
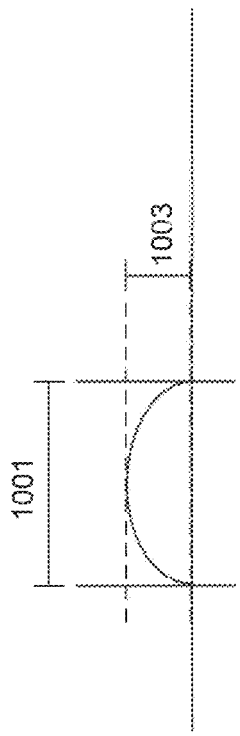
Figure 10A:
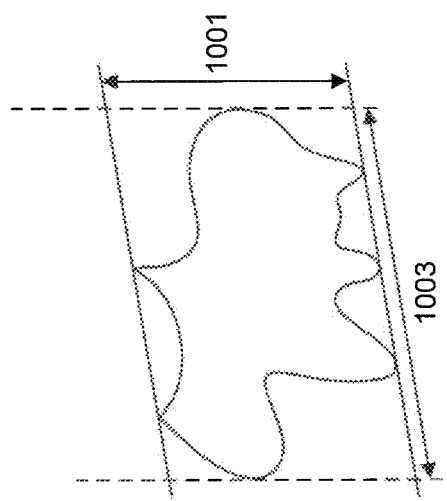

FIGS. 10A-10B show embodiments of nanostructured features.

DETAILED DESCRIPTION OF THE INVENTION

A major challenge in the performance of the all-solid-state EC devices is their slow response. However, if the solid EC layers are fabricated in such a way to consist of nanostructures with a large specific surface area, then the ions from the neighboring ion-conductive layers and/or ion-conductive electrolyte would have "an easy access" to the active sites in the EC layers, and thus, the EC stacks would show fast coloring and bleaching response, as well as high CE.

Embodiments disclosed herein relate to EC film stacks and methods of making the layers or films within the EC film stacks. Additionally, embodiments disclosed herein relate to nanostructured EC layers that may be incorporated into the film stacks with fast response and high color efficiency (CE). They may be of purely inorganic or organic or hybrid nature. Furthermore, the EC layers may consist of a single material or multiple materials. Embodiments disclosed herein also relate to methods of making nano-layer films including methods of making nanostructured films that that are faster and less-expensive ways of fabricating nanoscale-structured thin films compared to the traditional procedures of patterning and etching of bulk films.

The resulting EC film stacks have significantly faster response and improved coloration efficiency (CE) under externally applied voltage compared to bulk EC crystalline or amorphous films. These solid electro-chromic (EC) film stacks may be added or directly deposited on lens blank or SFB or other surface that needs controllable variable transmission property.

The following description recites various aspects and embodiments of the present invention. No particular embodiment is intended to define the scope of the invention. Rather, the embodiments merely provide non-limiting examples of various apparatuses, compositions, and methods that are at least included within the scope of the invention. The description is to be read from the perspective of one of ordinary skill in the art therefore, information well known to the skilled artisan is not necessarily included.

Additionally, the foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

As used herein, the term "comprise," "comprises," or "comprising" implies an open set, such that other elements can be present in addition to those expressly recited. As used herein, "consisting essentially of" implies a closed set. However, the closed set may include impurities and other variances that do not materially affect the basic characteristics of the closed set.

As used herein, the articles "a," "an," and "the" include plural referents, unless expressly and unequivocally disclaimed.

As used herein, the conjunction "or" does not imply a disjunctive set. Thus, the phrase "A or B is present" includes each of the following scenarios: (a) A is present and B is not present; (b) A is not present and B is present; and (c) A and B are both present. Thus, the term "or" does not imply an either/or situation, unless expressly indicated.

FIG. 9 shows an exemplary EC device with an exemplary EC film stack 1000 according to one embodiment. As used herein, an EC film stack refers to a multi-layer structure exhibiting EC properties, meaning that it reversibly changes color upon the application of an electric potential, or reversible changes color upon changing the magnitude of the electric potential applied. In some embodiments, the EC film stack is a structure that is transparent when no electric potential is applied to the stack, meaning that it transmits 75%, or at least 80%, or at least 90%, or at least 95%, or at least 97%, or at least 99% of visible light. In some embodiments, the EC film stack is a structure that when the electric potential is applied, blocks at least 10%, or at least 20%, or at least 30%, or at least 40%, or at least 50%, or at least 60%, or at least 70% of visible light. In some embodiments, the blocking is substantially uniform across the visible electromagnetic spectrum, in other embodiments it is not.

EC film stack 1000 comprises EC layers or films 2000A and 2000B, ion conducting intermediate layers 3000A and 3000B, ion conducting layer 4000A and 4000B, and electrodes 5000A and 5000B. While EC film stack 1000 is shown disposed between two substrates 6000A and 6000B, EC film stack 1000 may be disposed over only one substrate 6000A. Where a first layer is described as "disposed over" or "deposited over" a second layer, the first layer is disposed or deposited further away from the substrate. Additionally, there may be other layers between the first and second layer, unless it is specified that the first layer is "in contact with" the second layer. For example, an EC layer may be described as "disposed over" a substrate 6000, even though there are various other layers in between. When successive layers discussed herein are described as being disposed over each other, this is in reference to a single substrate regardless of whether or not a device may include more than one substrate. The substrate in which successive layers are disposed over will be apparent from the description and/or the figures. A layer that is disposed over a substrate or layer is not necessarily deposited over that substrate or layer. If a first layer is deposited over a second layer, the second layer must be present before the first layer is deposited over it.

As used herein, a "film" and a "layer" may be interchangeable.

In some embodiments, substrate 6000 is an "optical substrate." As used herein, the term "optical substrate" refers to any substrate suitable for use as a lens or lens blank (including semi-formed lens blank), or suitable for being formed into a lens or lens blank. In general, the optical substrate is a transparent material, meaning that it transmits at least 75%, or at least 80%, or at least 85%, or at least 90%, or at least 95%, or at least 97%, or at least 99% of visible light. The invention is not limited to any particular material, so long as the material is suitable for use as an optical substrate. Suitable materials include, but are not limited to, glass, quartz, or a polymeric material, such as polycarbonate. The material can have any index of refraction suitable for use in optical applications. The substrate may also include other coatings or films, as are well known in the field to which the invention is directed.

In some embodiments, the optical substrate is a lens, such as a lens for use in a pair of spectacles. As used herein, a "lens" is any device or portion of a device that causes light to converge or diverge (i.e., a lens is capable of focusing light). A lens may be refractive or diffractive, or a combination thereof. A lens may be concave, convex, or planar on one or both surfaces. A lens may be spherical, cylindrical, prismatic, or a combination thereof. A lens may be made of optical glass, plastic, thermoplastic resins, thermoset resins, a composite of glass and resin, or a composite of different optical grade resins or plastics. It should be pointed out that within the optical industry a device can be referred to as a lens even if it has zero optical power (known as plano or no optical power). In these cases, the lens can be referred to as a "plano lens." A lens may be either conventional or non-conventional. A conventional lens corrects for conventional errors of the eye including lower order aberrations such as myopia, hyperopia, presbyopia, and regular astigmatism. A non-conventional lens corrects for non-conventional errors of the eye including higher order aberrations that can be caused by ocular layer irregularities or abnormalities. The lens may be a single focus lens or a multifocal lens such as a Progressive Addition Lens or a bifocal or trifocal lens.

In other embodiments, substrate 6000 is not an ophthalmic substrate. These substrates include any substrate through which light travels to in its path to the eye. Some non-limiting examples include car windshields, building windows, and the like. Additionally, these substrates may also include glass substrates that may be affixed to ophthalmic substrates. As used herein, "glass" refers to an amorphous inorganic solid transparent material. It generally includes a major amount of silicon oxide, and can have minor amounts of other metal oxides, including, but not limited to, oxides of calcium, aluminum, magnesium, and sodium. Other oxides and dopants can be present as well. These substrates like the ophthalmic substrates, may also include other coatings or films, as are well known in the field to which the invention is directed.

While one ion conducting layer 4000 and two ion conducting intermediate layers 3000 are shown, EC film stack 1000 may have more or less layers. For example, EC film stack 1000 may have two conducting layers and no intermediate layers or one ion conducting layer and no intermediate layers. Additionally, while ion conducting intermediate layers 3000 are shown with a certain contour and depth, embodiments disclosed herein are not limited to this contour and depth. This is described in more detail in application Ser. No. 14/332,180 which is incorporated by reference in its entirety.

The EC film stack disclosed herein should survive all post-processing steps of the surfaces that it is applied to. For instance, if applied to ophthalmic SFBs, it should survive the surfacing to different lens prescriptions, edging into different lens shapes and grooving steps, which is not the case with non-solid EC devices utilizing liquid electrolytes.

EC film stacks disclosed herein respond significantly faster to an externally applied voltage compared to EC film stacks comprising bulk EC crystalline or amorphous films. They also have improved coloration efficiency (CE). In one embodiment, EC film stack 2000 may have a dynamic response of less than 30 seconds and a high CE greater than 50 $cm^2/C$ in the visible spectral range. As used herein the visible spectral range is from 400 nm-700 nm. These advantages are present even under low voltages, such as voltages equal or less than 4 Volts.

The response time and CE of an EC film stack is dependent on many factors, including but not limited to, the specific surface area of the EC layer. A higher specific surface area may improve response time and CE because it allows for more active sites on the EC layers and "easy access" of neighboring ion-conductive layers and/or ion conductive electrolytes. Thus, one way to characterize the responsiveness of an EC film is through the specific surface area of the EC layer.

Specific surface area is related to total surface area and may he defined as the total surface area of a solid material, film, or coating, per unit of its mass. One way to measure this parameter is by the Brunauer-Emmett-Teller (BET) theory, which is based on the physical absorption of gas molecules on the solid material, film, or coating. Unless disclosed otherwise, specific surface areas disclosed herein are determined through this method. In one embodiment, the EC layers disclosed herein have a specific surface area greater than 50 $m^2/g$.

In some embodiments, one way to increase the specific surface are of the EC layer is through nanostructures. FIGS. 2B, 3A, 3B, 5A-5B, and 8 show exemplary schematics of various nanostructured EC layers envisioned by the disclosure.

The term "nanostructured" may mean having nanosized features, the nano-sized features including at least one dimension between 1 and 500 nanometers. Nano-sized features include, but are not limited to, nanopores, nanospheres, nanograins, nanorods, nanoplatelets, and nanosized surface features, such as nanoridges, nanogrooves, and nanocolumns, in some embodiments, the nano-sized features may include nanoparticles. One way to determine the "size" of a feature is to consider the smallest distance between two parallel planes that do riot intersect the feature. For example, in FIG. 10A, the nanostructure has a feature size of 1001, not 1003. In some embodiments, the "smallest distance" is measured in a direction parallel to the plane of a surface on which the feature is fabricated, i.e. the smallest distance is the width or length, not the thickness. For example, in FIG. 10B, the size of the feature is 1001, not 1003.

FIGS. 8A-8L show exemplary schematic nanostructured EC layers with nano-columnar structures 600 deposited on surface 300. FIGS. 3A and 3B also show exemplary nanostructured EC layers with nano-columnar structures. Surface 300 is preferably a surface of an electrode, but may be the surface of any layer generally found in EC films stacks, including a surface of an ion-conducting layer or a surface of an intermediate ion-conducting layer. Additionally, it may also be the surface of a substrate 6000, like the one disclosed above. These columnar structures have a features size that may be determined as described above. For example, FIG. 8D has a feature size of 1001.

As seen in FIGS. 8C-8E and 8H, columnar structures include structures having variable widths or diameters along their length. Additionally, columnar structures 6000 may or may not be straight along their lengths. For example, some may have bends and curves along their lengths, as seen in FIGS. 8G and 8I-8L. Additionally, in some embodiments, they may also have protrusions extending from their length including fractal-like structures, such as the structure seen in FIG. 8F. FIG. 8A shows straight columnar structures (or pillars). FIG. 8B shows inclined columnar structures. FIG. 8I shows a columnar structure with helix. FIG. 8J shows a waved columnar structure. FIG. 8K shows a zig-zag columnar structure. FIG. 8L shows a zig-zag columnar structure with varying width. In some embodiments, columnar structures with greater surface area are preferred because a higher surface area allows for a larger number of active sites for ion exchange. These columns may be straight with protrusions or fractal-like structures along its length, like the structure shown in FIG. 8F, or with variable diameters along their length. However, in other embodiments, the higher surface area provided by these structures are not needed and a straight "smooth" column, like the one shown in FIG. 8A may be used.

Because columnar structures may include both structures that are generally straight and structures with bends and curves, there are two types of "lengths" that a columnar structure may have. One length is the approximate length. The approximate length may be measured in a straight line, starting from the base of the column to the point of the column that is furthest away from the base. The base of the column is where the structure meets the surface. The measurement is in the same direction as the overall direction that the column extends from the surface 300. For example, a columnar structure similar to one shown in FIG. 8A has approximate length 602a. Similarly, a columnar structure similar to the one shown in FIG. 8I has an approximate length 602i. While column 600i may have a zigzag configuration with bends along its length, the overall direction of its extension from the surface 300 is vertical. As another example, a columnar structure similar to one shown in FIG. 8b has approximate length 602b. The overall direction that column 600b extends from the surface 300 is at an angle.

On the other hand, the actual length of a columnar structure is not taken in a straight line but follows the bends and curves of the structure. Thus, for columnar structures without bends or curves, the approximate length is generally the same as the actual length, like in FIGS. 8A and 8B, in columnar structures with curves, the approximate length is often times shorter than the actual length of the columnar structure, like in FIGS. 8I and 8G.

The width of columnar structure may be measured where the column is at its widest point. The measurement is taken in a direction that is perpendicular to an imaginary line that bisects the column's actual length. For example, the columnar structure in FIG. 8F has a width 601f. To determine whether a structure is "columnar", the approximate length is compared to the width. In some embodiments, columnar structures 600 are structures having longer lengths than widths.

In preferred embodiments, an EC layer is comprised of more than one type of columnar structure, like the ones shown in FIGS. 3A-3B. However, in other embodiments, an EC layer may be comprised of repetitive similar columnar structures, like those seen in FIGS. 8A-8L.

EC layers may also other various types of nanostructured features besides columnar structures, such as nanopores, as seen in FIG. 5B, or nanorods, as seen in FIG. 5A. Additional EC layers may have a mixture of different kinds of nanostructures, such as, for example, a mixture of columnar structures and nanopores.

In some embodiments, the layers and films discussed above may be made using angle deposition. In other embodiments, they may be made using electrophoresis or electrodeposition. In yet some other embodiments, they may be made using atomic layer deposition. These methods provide faster and more efficient ways of fabricating these films as compared to patterning and etching of bulk films and are described below. While these embodiments are described as individual methods, the EC layers discussed above may be made with a combination of one or more of methods.

Angle Deposition

In some embodiments, the EC layer 2000 may be made using angle deposition. Angle deposition may include oblique-angle deposition (OAD) and glancing-angle deposition (GLAD). In general, OAD and GLAD are defined as evaporation or sputtering.

Figure 1A:
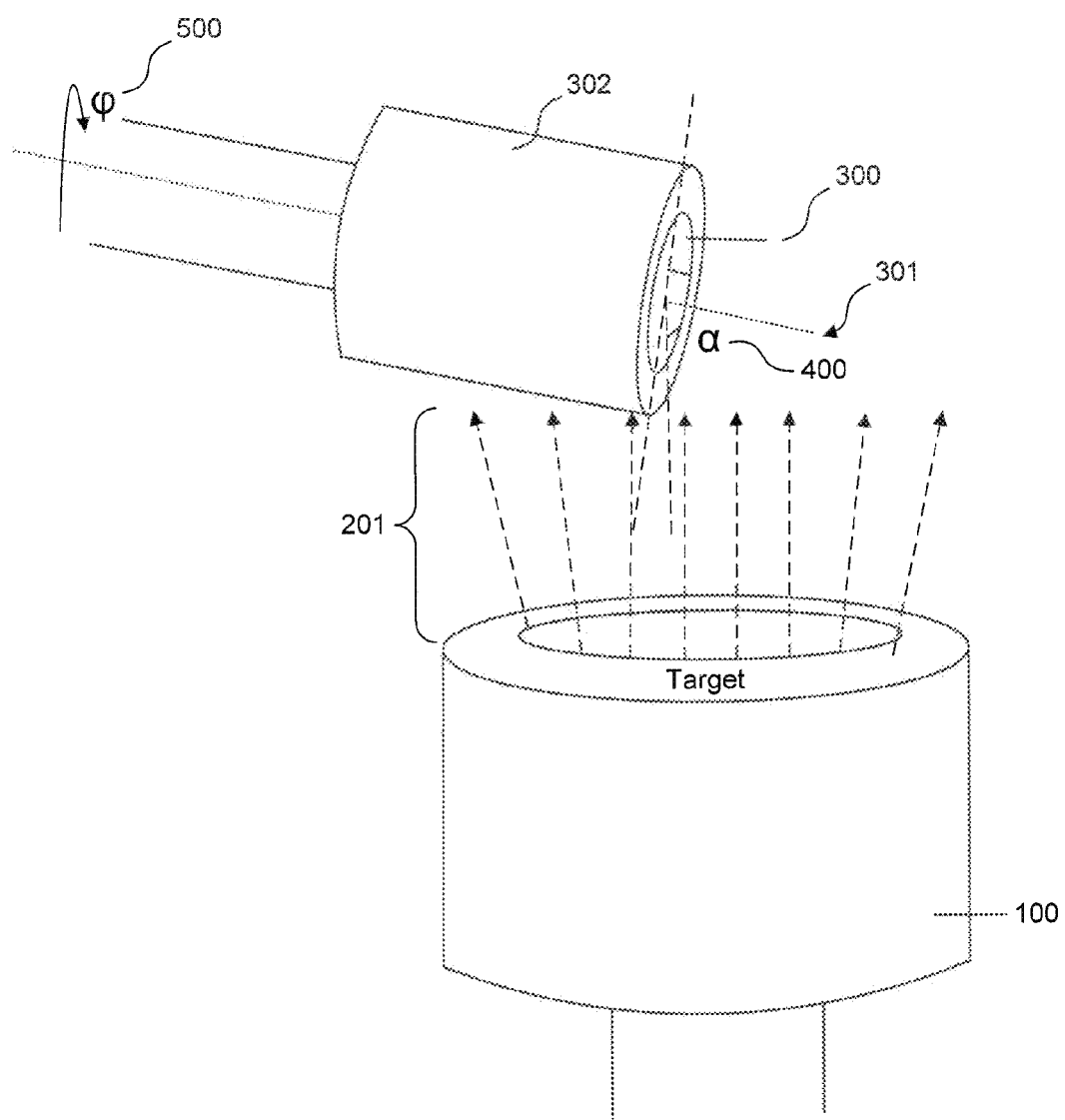
FIG. 1A shows a schematic representation of glancing angle deposition, according to one embodiment.
Figure 1B:
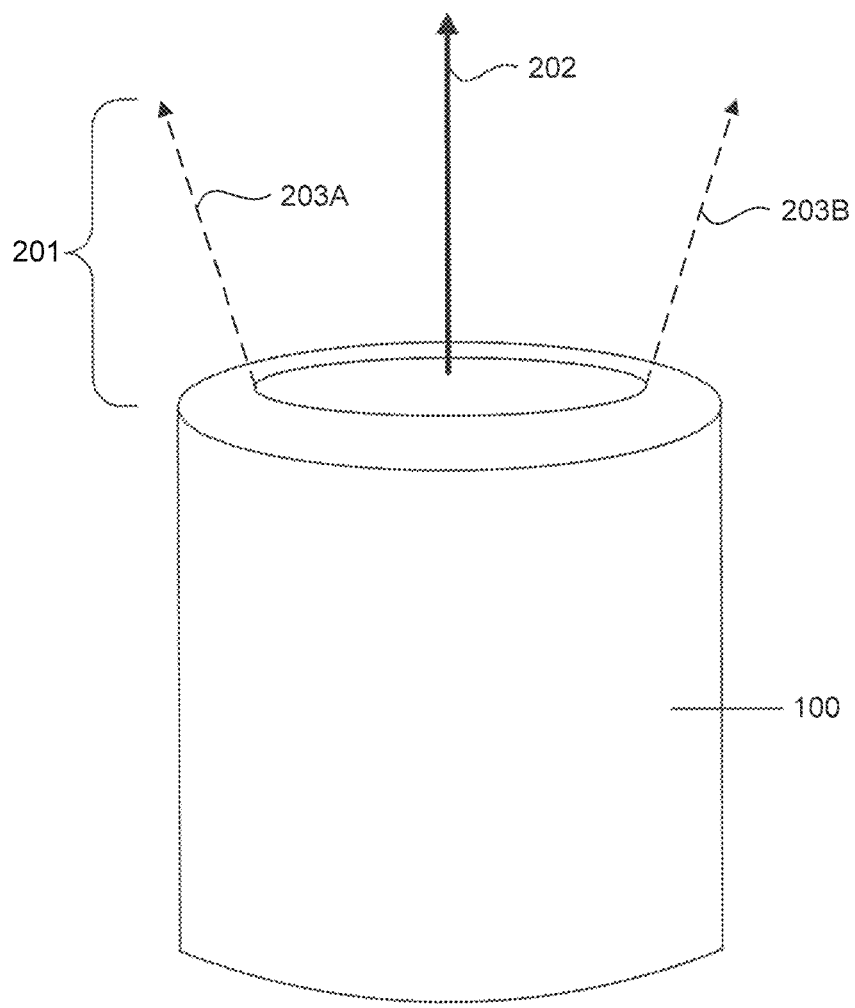
FIG. 1B shows a close up of the electro-chromic flux shown in FIG. 1A.
Figure 1C:
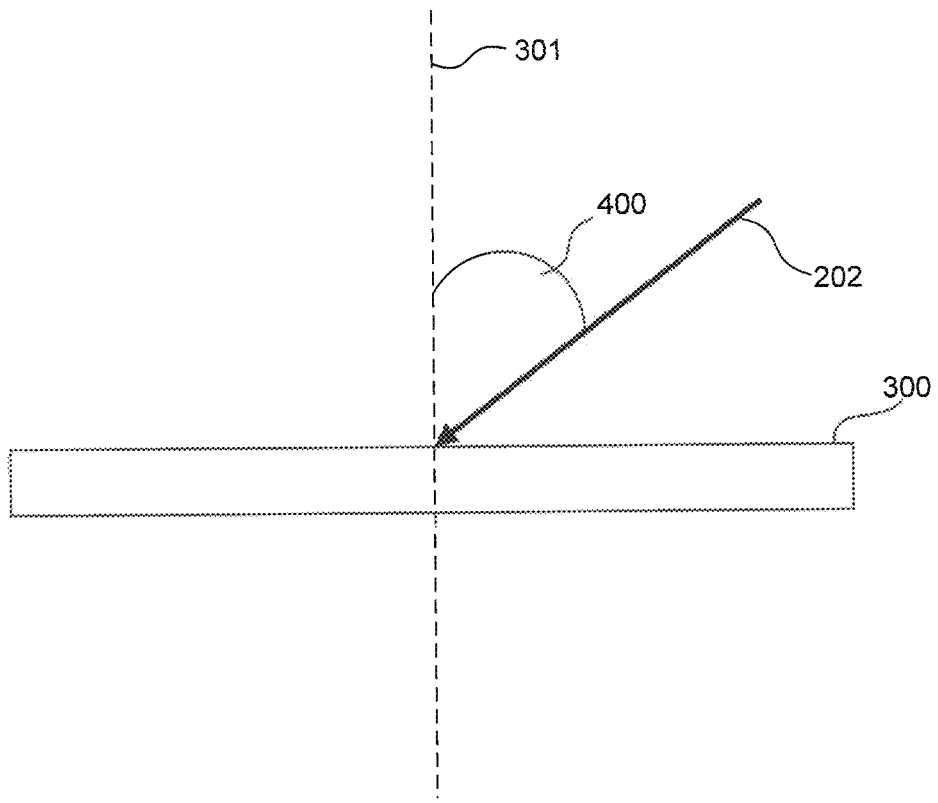
FIG. 1C shows the incident angle on the substrate shown in FIG. 1A.

FIG. 1 illustrates a schematic of GLAD and OAD. With these deposition techniques, an EC material 200 is deposited over a surface 300. The depositing of the EC material occurs by exposing the surface 300 to a flux 201 of the EC material 200 that is provided by source 100. In some embodiments, source 100 may be a magnetron.

In some embodiments, the EC material is selected from the group including but not limited to tungsten oxide, nickel oxide, iridium oxide, molybdenum oxide, vanadium oxide, and combinations thereof. In a preferred embodiment, the EC material comprises tungsten oxide. These materials may or may not electro-chromic depending on their oxidation state. One of ordinary skill in the art may be, however, to manipulate the oxidation state of these materials to make these oxides electro-chromic. For example, tungsten oxide, in its stoichiometric oxidation $WO_3$ state may not be electro-chromic. However, it may be manipulated by decreasing its oxidation state. Thus, for example, $WO_x$ where x is 2.6 may be electro-chromic. In some embodiments, the EC material 200 may comprise more than one EC material that are co-deposited at the same time. In other embodiments, the EC material consists essentially of a single electro-chromic material.

The surface 300 may held in place by can 302 that is controllable by a user. The surface 300 has a surface normal 301 that is perpendicular to the plane of the surface 300. This is shown in FIGS. 1, 1A, 1B. As the flux 201 exits source 100 and travels towards the surface 300, it travels in a first direction 202.

FIG. 1A is a close-up of the flux 201 and the first direction 202. In some embodiments, the traveling direction of the flux 201 may be represented as a single straight column. This means every portion of the flux 201 travels in the same direction and there are no directional outliers. However, in other embodiments, as shown in FIG. 1A, the flux 201 may travel towards the surface 300 in one main direction but with portions of the flux traveling in directional outliers 203A-B. Thus, as used herein, the "first direction" 202 is the average direction traveled by the flux. For example, in FIG. 1A, the first direction 202 is taken as an average of all directions traveled by the flux, including 203A and 203B.

As the flux 201 is deposited on the surface 300, flux 202 forms an incident angle with the surface normal 301. As used herein, "incident angle" is the angle formed by the first direction of the flux and the surface normal at the point of incident, or the point where the flux meets the surface, FIG. 1B shows a schematic drawing of the incident angle.

The incident angle is at least 1 degree and at most 89 degrees, and may be at least 1 degree and less than 10 degrees, at least 10 degrees and less than 80 degrees, and, preferably, at least 80 degrees and at most 89 degrees. When the incident angle is between 1 degree and less than 80 degrees, the technique may be referred to as oblique angle deposition (OAD). When the incident angle is between 80 degrees and less than 89 degrees, the technique may be referred to as glancing angle deposition (GLAD).

A characteristic of OAD and GLAD is the development of columnar structures 600 as seen in FIGS. 8A-8L. The origin of the columnar structures lies in the specific nucleation step, followed by the anisotropic, columnar growth greatly influenced by the so-called atomic-scale ballistic shadowing and limited surface diffusion. During OAD or GLAD, the surface 300 experiences ballistic shadowing during deposition. Ballistic shadowing prevents flux from directly reaching the shadowed regions of the surface. This is shown in FIGS. 2A-2B.

Figure 2B:
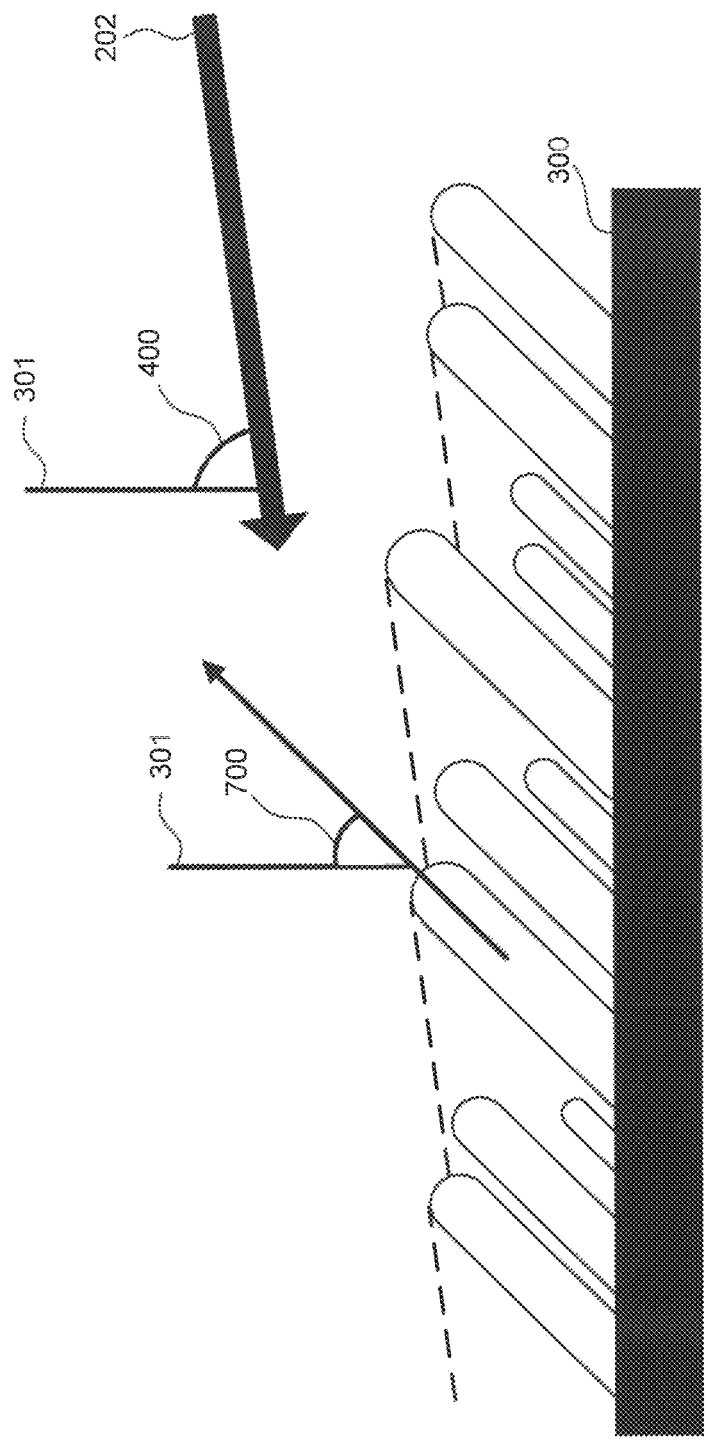
FIG. 2B shows columnar growth during angle deposition according to one embodiment.

FIG. 2A shows the initial nucleation stage at the beginning of deposition. This initial nucleation stage of EC layer growth roughens the surface in a random manner. As the nuclei 204 form, the shadowing effect will quickly become a determining factor in the EC layer growth. FIG. 2B shows progression of the deposition after the initial nucleation stage. A greater amount of material 200 is deposited onto the nuclei 204 than into the shadowed area 303 of the surface 300. This disparity is only increased as growth continues. Since only the tops of the nuclei 204 receive flux 201, the nuclei 204 will develop into columns which may be tilted in the direction of the incident flux. This is shown in FIG. 2B.

The incident angle may contribute to the magnitude of the shadowing effect. For example, at incident angles greater than 80 degrees, high shadowing effect may occur. In one embodiment, this high shadowing effect may result in columnar structures that are slanted towards the source of the flux. This is seen in FIG. 2B. In these embodiments, the columnar structures may form angle 700 with the surface normal 301. Thus, in this embodiment, the columnar structure is not parallel with surface normal 301. As used herein, parallel may include being at least 5 degrees off from one another. This angle may he smaller than the incident angle 400. This angle is the angle that the axis of rotation of the columnar structure makes with the surface normal. As the incident angles decrease, the shadowing effect may also decrease. One of ordinary skill in the art, with the benefit of this disclosure, may be able to manipulate the incident angle to form the desired angle of the columnar structure.

Additionally, in some embodiments, the surface 300 may he rotated relative to the flux to further generate and "design" various morphologies, like those seen in FIGS. 8C-8L, such as helixes, and zigzags. As used herein, "relative to the flux" means rotating either the surface or the source of the flux in relation to the other. Thus, the source may be kept still while the surface is rotated by angle 500 as shown in FIG. 1, the surface may be kept still while the source is rotated, or the surface and the source may both be rotated. In other embodiments, the surface 300 is not rotated relative to the flux. The degree of rotation may include slow continuous rotation, fast continuous rotation, and discrete rotation (also known as discontinuous rotation).

FIG. 3A shows SEM images of $WO_x$ EC layers deposited with an incident angle of 85 degrees with slow surface rotation relative to the flux. One columnar structure has a width of 601 at 480 nm and a height of 602 at 4.7 µm, FIG. 3B shows an SEM image of another exemplary EC layer. The material used was WOx, with an incident angle of 81.4 degrees and slow surface rotation relative to the flux. The resulting columnar structures may be seen. One structure has a width 601 of 380 nm and a height of 2.6 µm, While nanostructures shown are columnar, OAD and GLAD may be used to create other types of nanostructures, as disclosed above.

Overall, the final nanostructure is a complex interplay of many factors, including but not limited to, the incident angle, the presence or absence of substrate rotation, the type of rotation, substrate surface temperature during deposition, deposition rate, deposition power, and the EC material that is deposited. For instance, the greater the incident angle, the greater the shadowing effect will be. If there is a substrate rotation, then the resulting columns can have more structures on their surface and/or can be zig-zag structures. The substrate temperature affects the diffusion of the deposited particles; the higher the temperature, the more pronounced diffusion of deposited particles and more irregular structures can be expected than when the deposition is on substrate at room temperature. The nature of EC material affects the diffusion of the particles on the substrate (diffusion constant is an intrinsic property of each material). "Rougher" nanostructures can be fabricated by faster deposition rates. By adjusting the deposition power and rate, one can even control the type of nanostructures, e.g. columns, needles or grains. This includes not only the initial deposition parameters, but variation of those initial parameters during the course of the deposition. For example, a change in the deposition rate during the deposition process may result in structures with varying widths along their actual lengths. As another example, if deposition starts with substrate rotation and the rotation is stopped during the deposition process, the resulting structure may he thinner in the bottom and wider on top. Structures shown in FIGS. 8C, 8E, 8G, 8H, and 8L may he the result of a variation of these parameters during the deposition process. In some embodiments, when the variation of the parameters occurs near the end of the deposition process, the structures may be known has having "capping layers." The presence of these "capping layers" in the columnar structure indicate that a change in initial parameters may have occurred during deposition. One of ordinary skill in the art, with the benefit of this disclosure will be able to successfully apply vary these parameters to make the EC layers disclosed herein.

Further steps may be performed on EC layer and surface 300 after the deposition of EC layer on surface 300 to further process EC layer.

In one embodiment, a first ion-conducting layer may be deposited over the nanostructured EC layer. Additionally, a second ion-conducting layer may be deposited over the first ion-conducting layer after the first ion-conducting layer is deposited. This deposition may form an EC film stack that may be incorporated to create an EC device.

In some embodiments, angle deposition as described above may be used to form two surfaces having electrochromic layers. A first ion-conducting layer is then deposited over the first nanostructured EC layer. Then, a second ion-conducting is deposited over the second nanostructured layer. The first and second surfaces are then assembled such that the first ion-conducting layer and the second ion-conducting layer face each to form an electro-chromic system like the one shown in FIG. 9.

In one embodiment, this method may be combined with other methods such as sol-gel, dip-coating, spin-coating, knife coating, annealing, and sintering to yield the nanostructured layer. In some embodiments, these other methods may be post processing steps performed after the deposition of the electro-chromic material by GLAD or OAD.

Electrophoresis or Electro-Deposition

In some embodiments, the EC layer 2000 as described above, along with the different types of nanostructures as described above, may be made through electrophoresis or electro-deposition. Electrophoresis and electro-deposition both comprise depositing an EC material 200 over a surface 300 using an applied electric field. The material migrates through the liquid towards the appropriate surface, usually the surface of an electrode.

Table 1 compares the two techniques and FIG. 4 shows a schematic of both techniques.

TABLE I

Comparison of Electrophoretic and Electrolytic Deposition

| | Electrophoretic Deposition | Electrolytic Deposition |
|---|---|---|
| Medium | Suspension | Solution |
| Moving Species | Particles | Ions or complexes |
| Electrode Reactions | None | Electrogeneration of OH— and neutralization of cationic species |

TABLE I-continued

Comparison of Electrophoretic and Electrolytic Deposition

|  | Electrophoretic Deposition | Electrolytic Deposition |
|---|---|---|
| Preferred Liquid | Organic solvent | Mixed solvent (water-organic) |
| Required Conductivity of Liquid | Low | High |
| Deposition Rate | $1\text{-}10^3$ mm/min | $10^{-3}\text{-}1$ mm/min |
| Deposit Thickness | $1\text{-}10^3$ mm | $10^{-3}\text{-}10$ mm |
| Deposit Uniformity | Limited by size of particles | On nm scale |
| Deposit Stoichiometry | Controlled by stoichiometry of powders used for deposition | Can be controlled by use of precursors |

Electrophoresis may also be called electrophoretic deposition (EPD). It is a technique where the charged particles in a solvent migrate under the applied electric field supplied by power supply 800 and are deposited onto a surface of an electrode 801 (also known as a conductive surface). It a viable technique for creation of nanostructured layers and may be easily scaled-up for mass production.

FIG. 5A provides a schematic of EPD. As seen in FIG. 5A, the charged particles 205 migrate under an applied electric field towards surface of anode 801A and is deposited on anode 801A to form a nanostructured EC layer. Although FIG. 5A shows $Ni(OH)_2$ as the EC material that becomes NiO when deposited, other EC materials may he used as known in the art.

In some embodiments, the EC material is selected from the group including but not limited to tungsten oxide, nickel oxide, iridium oxide, molybdenum oxide, vanadium oxide, and combinations thereof. In a preferred embodiment, the EC material comprises tungsten oxide. These materials may or may not be electro-chromic depending on their oxidation state or state in which they are introduced as a precursor. One of ordinary skill in the art may be, however, to manipulate the oxidation state of these materials to make these oxides electro-chromic. For example, tungsten oxide, in its stoichiometric oxidation $WO_3$ state may not be electro-chromic. However, it may be manipulated by decreasing its oxidation state. Thus, for example, $WO_x$ where x is 2.6 may be electro-chromic. In some embodiments, the EC material that is used may comprise two EC materials that are co-deposited. In other embodiments, the EC material consists essentially of a single electro-chromic material.

Although FIG. 5A shows a specific type of nanostructure, this is in only one embodiment, and EPD may be used to create any of the nanostructures as described above. The final nanostructures that result from EPD are a complex interplay of many factors, including but not limited to: deposition time and rate, particle size, pH of the solution, solvent nature, surface conductivity, applied voltage, and suspension concentration. In one embodiment, the deposition thickness may be controlled by a variation of deposition time, voltage, or current density. In another embodiment, the deposition uniformity may be controlled by the applied electric field. For instance the effects of some of these parameters on the final nanostructures are as follows: the higher the deposition rate, the "rougher" structures, i.e. structures with greater surface area are possible. Deposition time will of course affect the thickness of the final EC layer. The higher applied voltage will result in higher deposition rate, and thus, rougher structures. The particle size and particle size distribution (if any), together with the deposition rate, will affect the final nanostructures and porosity in EC layer.

One of ordinary skill in the art, with the benefit of this disclosure would be able to manipulate these factors to arrive at the desired nanostructure layer.

Electro-deposition (ELD), also called electrolytic deposition or electroplating, is another simple, fast, and inexpensive method for nanostructured layer fabrication. In one embodiment, it may be used to create EC layers with one EC material.

In another embodiment, it may be used to make EC layers with more than EC material. A single material may be preferred in some situations because using one deposition material simplifies fabrication costs. In other situations, two or more materials may be preferred because it allows a blending of properties and achievement of overall layer characteristics that may not be possible with one single EC material. For example, ELD may be used to co-deposit two or more materials selected from the group of ceramic materials, metals, and polymers. In some embodiments, at least two different types of materials are co-deposited. These nano-hybrid layers exhibit advantageous properties compared that may not be achieved with one material and/or other methods.

A schematic of ELD is shown in FIG. 5B, where an EC nanostructured layer with nanopores is created using ELD. In FIG. 5B, a precursor material 1000 is first deposited in step 901. In one embodiment, this precursor material may be polystyrene. Other exemplary and non-limiting materials include polymethacrylate, polyacrylate, and polyethylene. After the precursor material is deposited, the electro chromic material 200, for example, nickel oxy-hydroxyl, is deposited in step 902. The precursor material is then removed in step 903. This results in a nanostructured EC layer with an open nanopore 210. Although FIG. 5B shows the precursor material as being a polystyrene sphere monolayer, other materials are within the scope of this disclosure. One of ordinary skill in the art, with the benefit of this disclosure would be able to manipulate these factors to arrive at the desired nanostructure layer. While FIG. 5B shows a specific type of nanostructure, this is merely one embodiment, and ELD may be used to create any of the nanostructures as described above.

Overall, the resulting nanostructure is complex interaction of different factors, including but not limited to: deposition time and rate, particle size, pH of the solution, solvent nature, surface conductivity, applied voltage, and suspension concentration. For example, the deposition uniformity may be controlled by the applied electric field. As another example, the deposition thickness may be controlled by a variation of deposition time, voltage, or current density. As yet another example, the ON and OFF time in ELD may be varied to create nanostructured layers disclosed herein, including unique composition and nano-structure. This may be accomplished by varying the basic parameters, such as pulse peak current density and may be done in a version of ELD called pulse electrodeposition. For instance the effects of some of these parameters on the final nanostructures are as follows: the higher the deposition rate, the "rougher" structures, i.e. structures with greater surface area are possible. Deposition time will of course affect the thickness of the final EC layer. The higher applied voltage will result in higher deposition rate, and thus, rougher structures. The particle size and particle size distribution (if any), together with the deposition rate, will affect the final nanostructures and porosity in EC layer.

In one embodiment, ELD and EPD may be combined with other methods such as sol-gel, dip-coating, spin-coating, knife coating, annealing, and sintering to yield the nanostructured layers. In some embodiments, these other methods may be post processing steps performed after the deposition of the electro-chromic material by ELD or EPD.

Atomic Layer Deposition

In another embodiment, the EC layer 2000 and surrounding ion-conducting layer may be made using atomic layer deposition (ALD).

ALD refers to the method whereby the layer growth occurs by exposing the surface to its starting materials alternately. ALD may be performed at or below atmospheric pressures. In comparison with chemical vapor deposition (CVD), while both ALD and CVD use chemical (molecular) precursors, the difference between the techniques is that the former uses self-limiting chemical reactions to control in a very accurate way the thickness and composition of the film deposited. In this regard, ALD can be considered as taking the best of CVD (the use of molecular precursors and atmospheric or low pressure) and molecular beam epitaxy (MBE=atom-by-atom growth and a high control over film thickness) and combining them in a single method.

A schematic of ALD is shown in FIGS. 6A-6D. In FIG. 6A, a monolayer of a precursor material is deposited over a first surface by exposing it to a first gaseous precursor molecule (e.g. volatile compound of the element) in excess. During this step, the temperature and gas flow is adjusted so that only one monolayer of the precursor material (also known as the first reactant) is chemisorbed onto the surface. In some embodiments, the excess of the reactant, which is in the gas phase or physisorbed on the surface, is then purged out of the chamber with an inert gas pulse. In other embodiments, purging is not done. The surface is then exposed to a vapor reactant (also known as the second reactant). The second reactant then chemisorbs and undergoes an exchange reaction with the first reactant on the surface in FIG. 6C. This results in the formation of a solid molecular nano-layer and a gaseous side product that may then be removed with an inert gas purge in FIG. 6D.

ALD may be used to form a nano-layer on the surface with relatively good thickness control. In some embodiments, this nano-layer does not comprise nanostructures and has a uniform thickness across the surface of deposition. In one embodiment, this uniform thickness may range from less than 1 nm to a few nm thick. Because ALD may be useful in forming layers with uniform thickness, it may be used in conjunction with another method, such as those described above, to form an intermediate conformed layer deposited over the EC layer with nano-structure and high irregular features. Such a layer deposited by ALD may include the ion-conducting layers 3000 as shown in FIG. 9.

In some embodiments, ALD may be used to form a nano-layer comprising nanostructures for EC layers 3000. These EC layers may comprise similar nanostructures as discussed above. As such, the materials used in ALD may be similar to those described in relation to the other methods for EC materials, or may be different materials, such as typical materials used in ion-conducting layers including but not limited to metals, metal oxides, and polymers.

In one embodiment, this method may be combined with other methods such as sol-gel, dip-coating, spin-coating, knife coating, annealing, and sintering to yield the nanolayers. In some embodiments, these other methods may be post processing steps performed after the deposition of the nano-layer material by ALD.

It is appreciated that while these three methods are described as three separate embodiments, EC layer and EC films disclosed herein may be manufactured using a combination of two or more of the described techniques. For example, FIGS. 7A-7C shows schematics of different nanostructured EC layers. FIG. 7A shows an EC layer 2000 comprised of a single EC material 200A. FIG. 7B shows an EC layer comprised of two different materials 200A and 200B that were prepared with the same technique. For example the material may be undergoing the same transition, cathodic or anodic coloration, and may be selected to he an inorganic oxide, PEDOT, viologen, or PB. FIG. 7C shows an EC layer made of two materials 200A and 200B (dotted lines) prepared by two different techniques. In one embodiment, these materials may undergo the same transition, cathodic or anodic coloration, FIG. 7C also shows an EC layer made of one material deposited by two different techniques (two 200A, one represented by dotted lines). In one embodiment, the same material in FIG. 7C may be or without changes in the stoichiometry, such as WO3 and WOx, where x is 2.7-2.9.

While some concepts are described herein with respect to only one of the four methods, and these embodiments are described for an electro-chromic device, one of skilled in the art can readily understand that these concepts can also be applied to other types of devices requiring nanostructured layers and nano-layers.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to he interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method comprising:
   depositing an electro-chromic material over a first surface having a first surface normal to form a first nanostructured electro-chromic layer over an ophthalmic substrate by exposing the first surface to a flux of the electro-chromic material traveling in a first direction;
   wherein an incident angle between the first direction and the first surface normal is at least 1 degree and at most 89 degrees, and
   wherein the ophthalmic substrate is a member of the group consisting of a lens blank or a semi-finished lens blank.

2. The method of claim 1, wherein the incident angle is at least 1 degree and less than 10 degrees.

3. The method of claim 1, wherein the incident angle is at least 10 degrees and less than 80 degrees.

4. The method of claim 1, wherein the incident angle is at least 80 degrees and at most 89 degrees.

5. The method of claim 1, further comprising rotating the first surface relative to the flux while depositing the electro-chromic material.

6. The method of claim 1, further comprising:
depositing a first ion-conducting layer over the first nano-structured electro-chromic layer after depositing the electro-chromic material; and
depositing a second ion-conducting layer over the first ion-conducting layer after depositing the first ion-conducting layer to form an electro-chromic optical device.

7. The method of claim 1,
wherein the electro-chromic material comprises two electro-chromic materials; and
the step of depositing comprises co-depositing two electro-chromic materials over the surface.

8. The method of claim 1, wherein the first nanostructured electro-chromic layer comprises at least one columnar structure.

9. The method of claim 8, wherein the at least one columnar structure and the first surface normal form an angle that is less than the incident angle.

10. The method of claim 1, wherein the first nanostructured electro-chromic layer has at least one feature size ranging from 1 nanometer to 500 nanometers.

11. The method of claim 1, wherein the electro-chromic material is selected from a group consisting of: tungsten oxide, nickel oxide, iridium oxide, molybdenum oxide, vanadium oxide, and combinations thereof.

12. The method of claim 1, wherein formation of the first nanostructured electro-chromic layer is accomplished by a combination of: (1) exposing the first surface to the flux of the electro-chromic material traveling in the first direction, and (2) at least one of sol-gel, dip-coating, spin-coating, knife coating, annealing, or sintering.

13. The method of claim 1, wherein the first nanostructured electro-chromic layer has a specific surface area greater than 50 $m^2/g$.

14. The method of claim 1, wherein the first nanostructured electro-chromic layer has a coloration efficiency of greater than 50 $cm^2/C$.

15. The method of claim 1, wherein the first nanostructured electro-chromic layer comprises a mixture of two different electro-chromic materials.

16. A method comprising:
depositing a first electro-chromic material over a first surface having a first surface normal to form a first nanostructured electro-chromic layer over an ophthalmic substrate by exposing the first surface to a first flux of the first electro-chromic material traveling in a first direction;
wherein a first incident angle between the first direction and the first surface normal is at least 1 degree and at most 89 degrees;
depositing a second electro-chromic material, different than the first electro-chromic material, over a second surface having a second surface normal to form a second nanostructured electro-chromic layer over the ophthalmic substrate by exposing the second surface to a second flux of the second electro-chromic material traveling in a second direction;
wherein a second incident angle between the second direction and the second surface normal is at least 1 degree and at most 89 degrees;
depositing a first ion-conducting layer over the first nanostructured electro-chromic layer;
depositing a second ion-conducting layer over the second nanostructured electro-chromic layer; and
assembling the first surface and the second surface such that the first ion-conducting layer and the second ion-conducting layer are in contact with each other to form an electro chromic optical system.

17. The method of claim 1, wherein the angle deposition is glancing-angle deposition or oblique-angle deposition.

18. The method of claim 1, wherein the electro-chromic material comprises $WO_x$, where x is in a range of 2.7 to 2.9.

19. The method of claim 5, wherein rotating the first surface relative to the flux while depositing the electro-chromic material comprises discontinuous rotation.

20. The method of claim 16, wherein the ophthalmic substrate is a member of the group consisting of a lens, a lens blank, or a semi-finished lens blank.

21. A method comprising:
depositing non-stoichiometric tungsten oxide over a surface to form a nanostructured electro-chromic layer over a semi-finished lens blank by exposing the surface to a flux of the non-stoichiometric tungsten oxide at an incident angle of at least 1 degree and at most 89 degrees with respect to the surface.

22. The method of claim 21, further comprising:
surfacing the semi-finished lens blank to a lens prescription after depositing the non-stoichiometric tungsten oxide.

23. The method of claim 21, further comprising:
edging the semi-finished lens blank to a lens shape after depositing the non-stoichiometric tungsten oxide.

24. The method of claim 21, further comprising:
actuating the nanostructured electro-chromic layer to produce a dynamic response in less than 30 seconds.

25. The method of claim 24, wherein actuating the nanostructured electro-chromic layer comprises:
applying a voltage of equal or less than 4 volts to the nanostructured electro-chromic layer.

* * * * *